United States Patent
Van Dal et al.

(10) Patent No.: US 10,475,897 B2
(45) Date of Patent: Nov. 12, 2019

(54) III-V SEMICONDUCTOR LAYERS, III-V SEMICONDUCTOR DEVICES AND METHODS OF MANUFACTURING THEREOF

(71) Applicant: TAIWAN SEMICONDUCTOR MANUFACTURING CO., LTD., Hsinchu (TW)

(72) Inventors: Mark Van Dal, Linden (BE); Matthias Passlack, Huldenberg (BE); Martin Christopher Holland, Bertem (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/834,757

(22) Filed: Dec. 7, 2017

(65) Prior Publication Data
US 2018/0108747 A1  Apr. 19, 2018

Related U.S. Application Data

(62) Division of application No. 15/360,484, filed on Nov. 23, 2016, now Pat. No. 9,876,088.
(Continued)

(51) Int. Cl.
H01L 29/423 (2006.01)
H01L 29/20 (2006.01)
(Continued)

(52) U.S. Cl.
CPC .... H01L 29/42392 (2013.01); H01L 21/0243 (2013.01); H01L 21/02057 (2013.01);
(Continued)

(58) Field of Classification Search
CPC ......... H01L 29/42392; H01L 29/66469; H01L 29/785; H01L 29/66795; H01L 29/0673;
(Continued)

(56) References Cited

U.S. PATENT DOCUMENTS

2012/0018702 A1* 1/2012 Javey .................. H01L 21/2233
257/14
2013/0270512 A1* 10/2013 Radosavljevic ..........................
H01L 21/823821
257/9
(Continued)

FOREIGN PATENT DOCUMENTS

WO   2011/087580 A1   7/2011

OTHER PUBLICATIONS

Notice of Allowance issued in U.S. Appl. No. 15/360,484, dated Sep. 7, 2017.

*Primary Examiner* — Yosef Gebreyesus
(74) *Attorney, Agent, or Firm* — McDermott Will & Emery LLP

(57) ABSTRACT

In a method of forming a Group III-V semiconductor layer on a Si substrate, a first source gas containing a Group V element is supplied to a surface of the Si substrate while heating the substrate at a first temperature, thereby terminating the Si surface with the Group V element. Then, a second source gas containing a Group III element is supplied to the surface while heating the substrate at a second temperature, thereby forming a nucleation layer directly on the surface of the Si substrate. After the nucleation layer is formed, the supply of the second source gas is stopped and the substrate is annealed at a third temperature while the first source gas being supplied, thereby foaming a seed layer. After the annealing, the second source gas is supplied while
(Continued)

heating the substrate at a fourth temperature, thereby forming a body III-V layer semiconductor on the seed layer.

20 Claims, 17 Drawing Sheets

Related U.S. Application Data

(60) Provisional application No. 62/396,549, filed on Sep. 19, 2016.

(51) Int. Cl.
    *H01L 29/06*     (2006.01)
    *H01L 21/762*     (2006.01)
    *H01L 29/66*     (2006.01)
    *H01L 29/786*     (2006.01)
    *H01L 21/02*     (2006.01)
    *H01L 21/764*     (2006.01)
    *H01L 29/78*     (2006.01)

(52) U.S. Cl.
CPC .... *H01L 21/0262* (2013.01); *H01L 21/02381* (2013.01); *H01L 21/02463* (2013.01); *H01L 21/02502* (2013.01); *H01L 21/02546* (2013.01); *H01L 21/02658* (2013.01); *H01L 21/762* (2013.01); *H01L 21/764* (2013.01); *H01L 29/0673* (2013.01); *H01L 29/20* (2013.01); *H01L 29/66469* (2013.01); *H01L 29/66545* (2013.01); *H01L 29/66795* (2013.01); *H01L 29/7848* (2013.01); *H01L 29/78696* (2013.01)

(58) Field of Classification Search
CPC . H01L 29/045; H01L 29/20; H01L 29/66545; H01L 29/7848; H01L 29/7896; H01L 21/02057; H01L 21/02381; H01L 21/0243; H01L 21/02463; H01L 21/02502; H01L 21/02546; H01L 21/0262; H01L 21/02658; H01L 21/762; H01L 21/764
See application file for complete search history.

(56) References Cited

U.S. PATENT DOCUMENTS

| | | | |
|---|---|---|---|
| 2014/0091360 A1* | 4/2014 | Pillarisetty | H01L 29/7853 257/190 |
| 2014/0151765 A1* | 6/2014 | Franklin | H01L 51/055 257/288 |
| 2014/0329376 A1 | 11/2014 | Sanchez et al. | |
| 2014/0353593 A1* | 12/2014 | Smets | H01L 29/66666 257/39 |
| 2016/0079394 A1* | 3/2016 | Li | H01L 29/66795 257/347 |

* cited by examiner

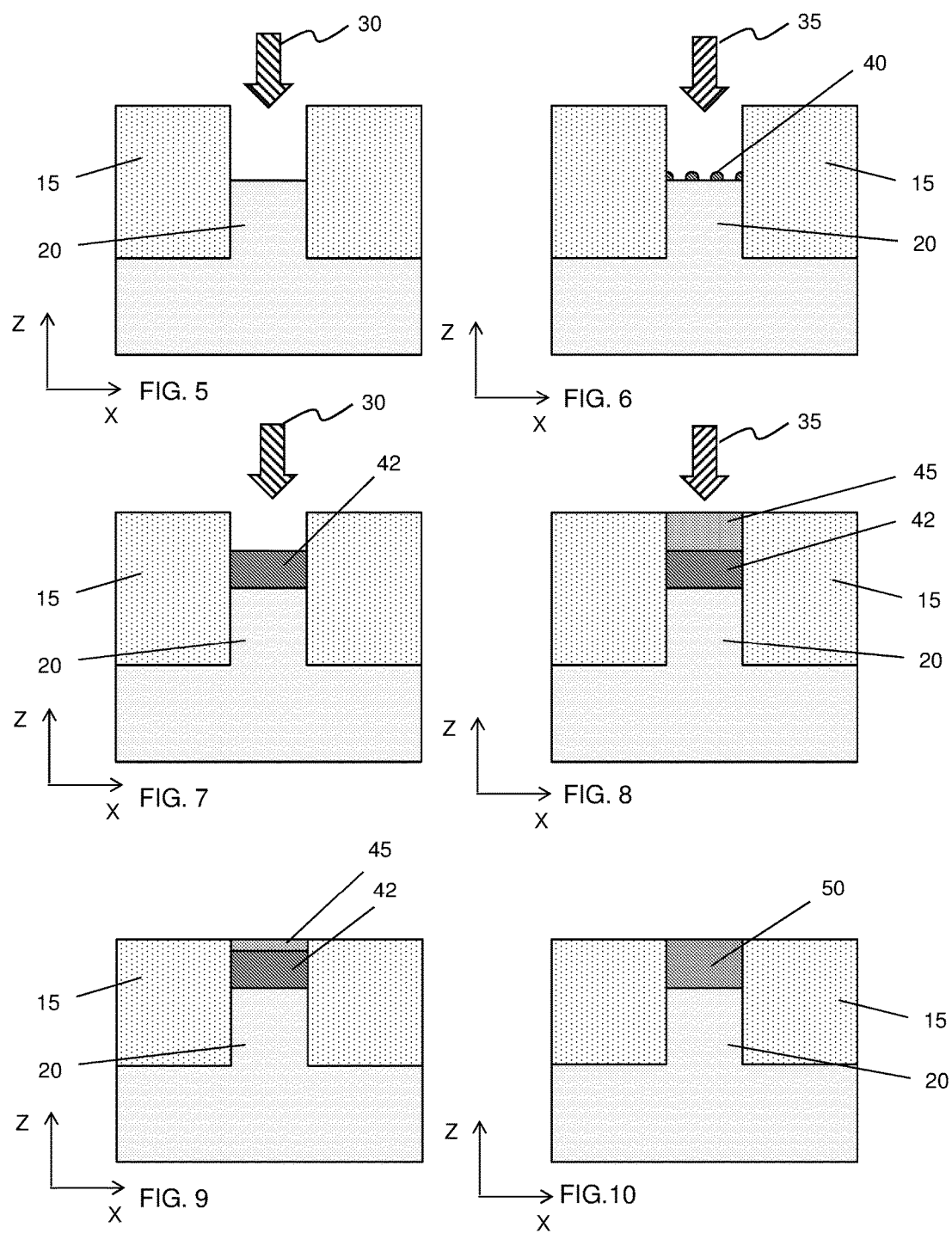

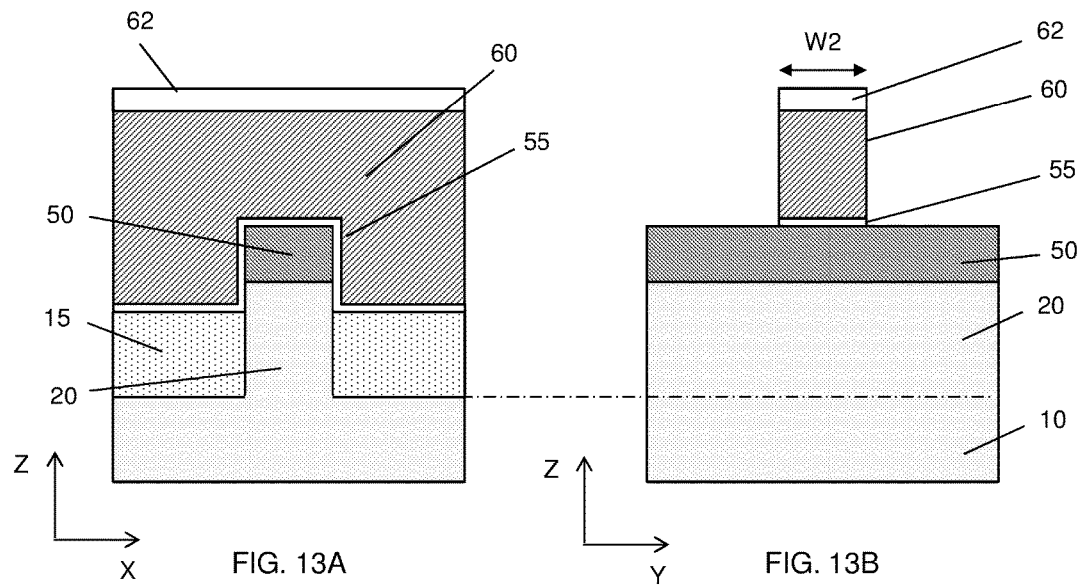
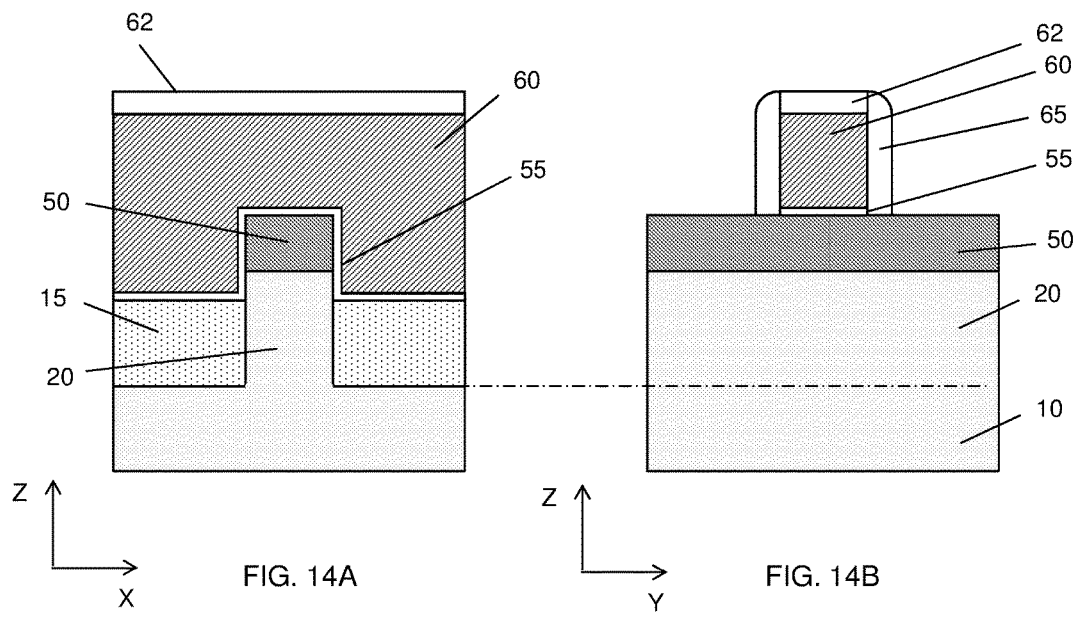

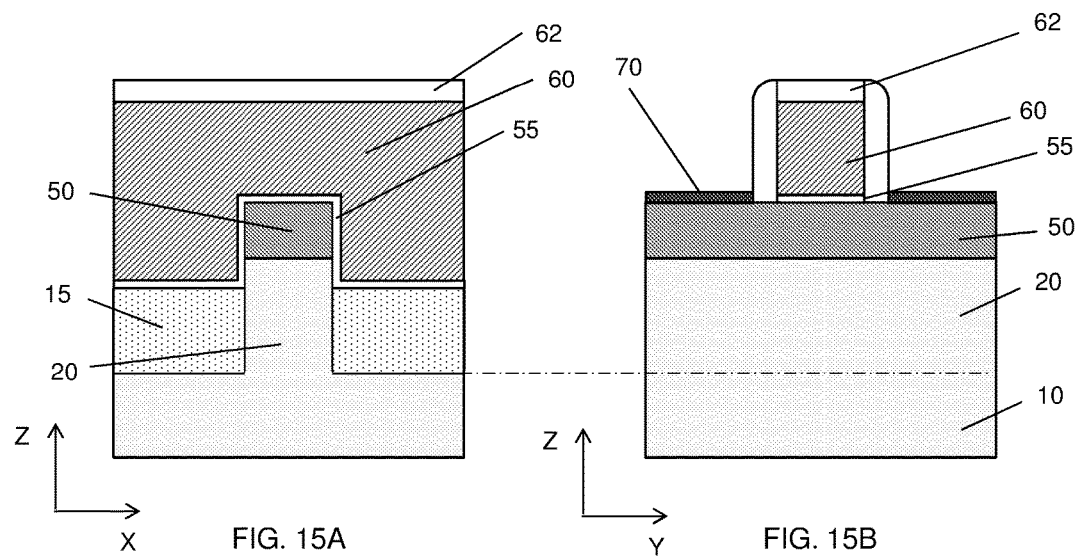
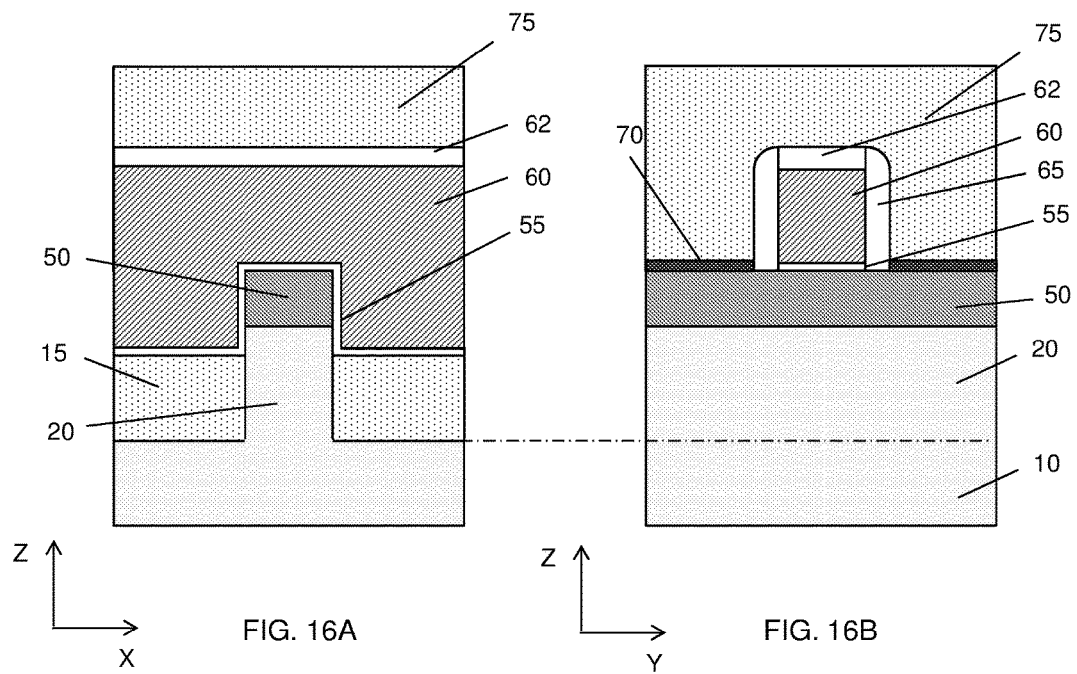

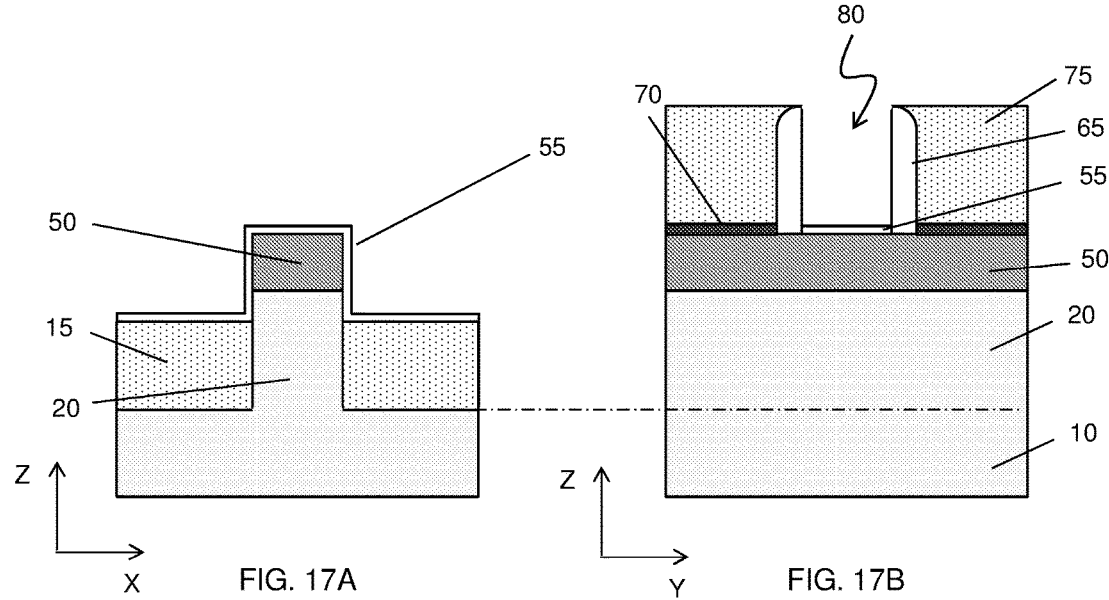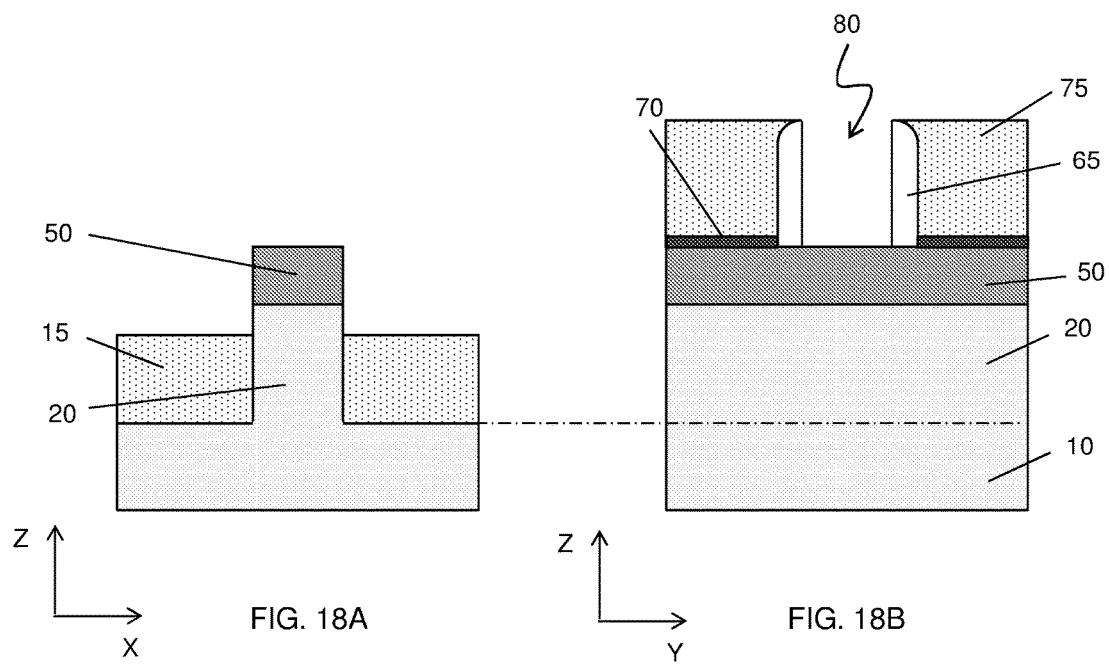

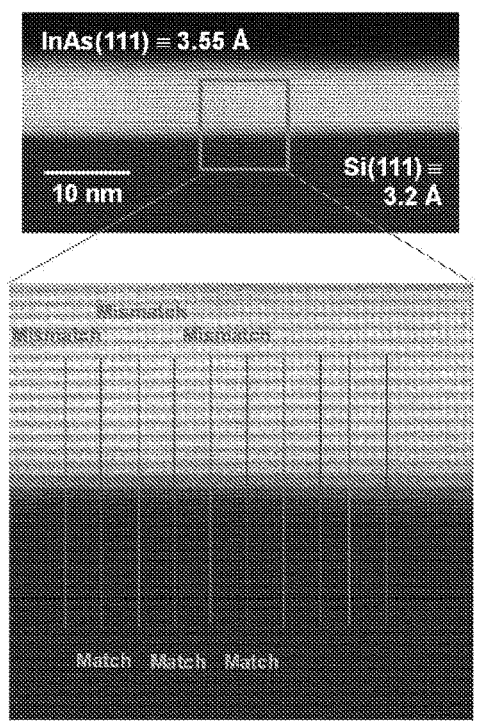
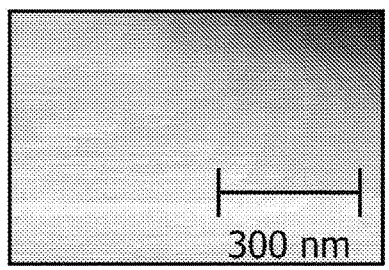 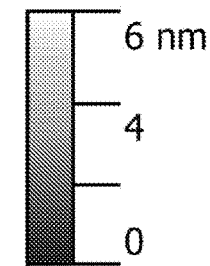
FIG. 27B
FIG. 27A

III-V SEMICONDUCTOR LAYERS, III-V SEMICONDUCTOR DEVICES AND METHODS OF MANUFACTURING THEREOF

RELATED APPLICATIONS

This application is a division of U.S. application Ser. No. 15/360,484, filed on Nov. 23, 2016, which claims the priority of U.S. Provisional Application No. 62/396,549 filed on Sep. 19, 2016, the entire contents of which applications are incorporated herein by reference.

TECHNICAL FIELD

This disclosure relates to Group III-V (III-V) semiconductor layers, III-V semiconductor devices, such as gate-all-around (GAA) field effect transistors (FETs), and methods of manufacturing the same. More particularly, this disclosure describes device quality III-V semiconductor layers directly grown on a silicon substrate for use in electronic, optical, optoelectronic, and magnetic devices.

BACKGROUND

The integration of Group semiconductors on a silicon (Si) substrate has been an active field of research for more than 30 years. Various approaches including growth of buffer layers to accommodate the lattice mismatch between the Si substrate and the III-V layer, Si-on-insulator (SOI), epitaxial transfer methods, epitaxial lateral overgrowth, selective epitaxy on patterned substrates, and aspect-ratio-trapping (ART) techniques have been investigated. However, significant levels of defects, high cost, and complex integration schemes have hampered large scale commercial impact.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5 shows an exemplary cross sectional view of one of the various stages for manufacturing a III-V semiconductor FET device according to one embodiment of the present disclosure.

FIG. 6 shows an exemplary cross sectional view of one of the various stages for manufacturing a III-V semiconductor FET device according to one embodiment of the present disclosure.

FIG. 7 shows an exemplary cross sectional view of one of the various stages for manufacturing a III-V semiconductor FET device according to one embodiment of the present disclosure.

FIG. 8 shows an exemplary cross sectional view of one of the various stages for manufacturing a III-V semiconductor FET device according to one embodiment of the present disclosure.

FIG. 9 shows an exemplary cross sectional view of one of the various stages for manufacturing a III-V semiconductor FET device according to one embodiment of the present disclosure.

FIG. 10 shows an exemplary cross sectional view of one of the various stages for manufacturing a III-V semiconductor FET device according to one embodiment of the present disclosure.

FIG. 11A corresponds to the cross sectional view along X-X of FIG. 1B, and FIG. 11B corresponds to the cross sectional view along Y-Y of FIG. 1B.

FIG. 12A corresponds to the cross sectional view along X-X of FIG. 1B, and FIG. 12B corresponds to the cross sectional view along Y-Y of FIG. 1B.

FIGS. 13A and 13B show exemplary cross sectional views of one of the various stages for manufacturing a III-V semiconductor FET device according to one embodiment of the present disclosure. FIG. 13A corresponds to the cross sectional view along X-X of FIG. 1B, and FIG. 13B corresponds to the cross sectional view along Y-Y of FIG. 1B.

FIGS. 14A and 14B show exemplary cross sectional views of one of the various stages for manufacturing a III-V semiconductor FET device according to one embodiment of the present disclosure. FIG. 14A corresponds to the cross sectional view along X-X of FIG. 1B, and FIG. 14B corresponds to the cross sectional view along Y-Y of FIG. 1B.

FIGS. 15A and 15B show exemplary cross sectional views of one of the various stages for manufacturing a III-V semiconductor FET device according to one embodiment of the present disclosure. FIG. 15A corresponds to the cross sectional view along X-X of FIG. 1B, and FIG. 15B corresponds to the cross sectional view along Y-Y of FIG. 1B.

FIGS. 16A and 16B show exemplary cross sectional views of one of the various stages for manufacturing a III-V semiconductor FET device according to one embodiment of the present disclosure. FIG. 16A corresponds to the cross sectional view along X-X of FIG. 1B, and FIG. 16B corresponds to the cross sectional view along Y-Y of FIG. 1B.

FIGS. 17A and 17B show exemplary cross sectional views of one of the various stages for manufacturing a III-V semiconductor FET device according to one embodiment of the present disclosure. FIG. 17A corresponds to the cross sectional view along X-X of FIG. 1B, and FIG. 17B corresponds to the cross sectional view along Y-Y of FIG. 1B.

FIGS. 18A and 18B show exemplary cross sectional views of one of the various stages for manufacturing a III-V semiconductor FET device according to one embodiment of the present disclosure. FIG. 18A corresponds to the cross sectional view along X-X of FIG. 1B, and FIG. 18B corresponds to the cross sectional view along Y-Y of FIG. 1B.

FIG. 19A corresponds to the cross sectional view along X-X of FIG. 1B, and FIG. 19B corresponds to the cross sectional view along Y-Y of FIG. 1B.

FIG. 20A corresponds to the cross sectional view along X-X of FIG. 1B, and FIG. 20B corresponds to the cross sectional view along Y-Y of FIG. 1B.

FIG. 21A corresponds to the cross sectional view along X-X of FIG. 1B, and FIG. 21B corresponds to the cross sectional view along Y-Y of FIG. 1B.

FIG. 22A corresponds to the cross sectional view along X-X of FIG. 1B, and FIG. 22B corresponds to the cross sectional view along Y-Y of FIG. 1B.

FIGS. 27A and 27C show images of the InAs layers directly grown on the Si substrate observed by a high-resolution cross-sectional transmission microscopy (HR-TEM) and FIG. 27B shows an image of the InAs layers directly grown on the Si substrate observed by atomic force microscopy (AFM).

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." The order of the following operations can be changed. One or more additional operations may be performed during or after the following operations, and one or more of the following operations can be removed.

Figure 1A:
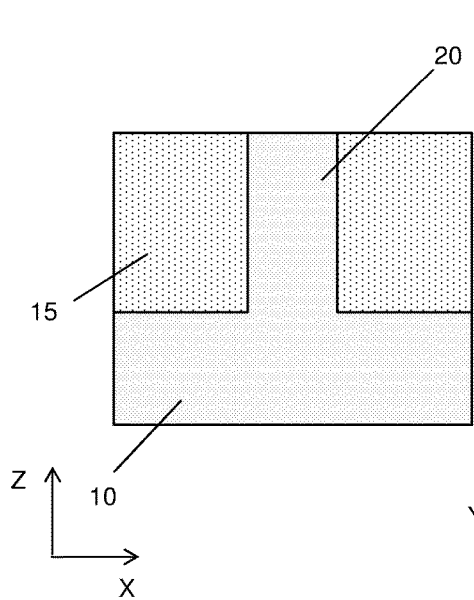
FIGS. 1A and 1B show exemplary views of one of the various stages for manufacturing a III-V semiconductor FET device according to one embodiment of the present disclosure
Figure 1B:
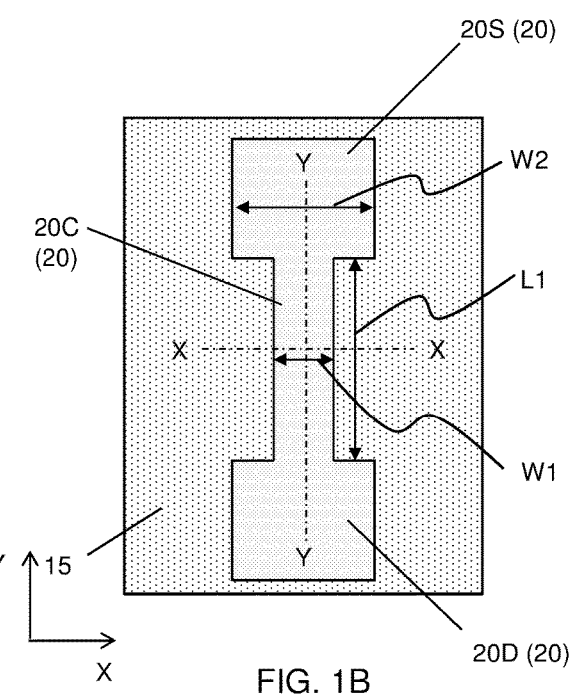

As shown in FIGS. 1A and 1B, an insulating layer, a shallow trench isolation (STI) 15 is formed in a substrate 10. The substrate 10 is a silicon (Si) substrate, such as a silicon wafer having a diameter of 150 mm, 200 mm or 300 mm, in one embodiment. A mask layer including a silicon oxide layer and a silicon nitride layer is formed on the substrate 10. After the mask layer is formed, the mask layer is patterned by lithography and etching operations. Then, by using the patterned mask layer as an etching mask, the substrate 10 is trench-etched to form trenches. A depth of the trenches is in a range from about 100 nm to about 1 μm in some embodiments. The trenches are filled with an insulating (dielectric) material 15. One or more layers of insulating materials such as silicon oxide, silicon oxynitride or silicon nitride, are formed by LPCVD (low pressure chemical vapor deposition), plasma-CVD or flowable CVD. The insulating material layer may be formed by one or more layers of spin-on-glass (SOG), SiO, SiON, SiOCN and/or fluorine-doped silicate glass (FSG). After forming the insulating material layer, a planarization operation including a chemical mechanical polishing (CMP) or an etch-back process, is performed so as to remove upper part of the insulating material layer, such that the STI 15 is formed, as shown in FIG. 1A. The substrate not etched, and surrounded or separated by the STI 15 in plan view is a Si region 20, as shown in FIG. 1B. Since the Si region has a narrow width, the Si region 20 may be referred to as a Si fin.

As shown in FIG. 1B, the Si region 20 has a for-channel region 20C, a for-source region 20S and a for-drain region 20D. The width W1 of the for-channel region 20C is in a range from about 5 nm to about 50 nm, in some embodiments, and is in a range from about 10 nm to about 20 nm in other embodiments. The length L1 of the for-channel region 20C is in a range from about 50 nm to about 200 nm in some embodiments, and is in a range from about 70 nm to about 120 nm in other embodiments. The width W2 of the for-source and for-drain regions 20S, 20D is equal to or greater than the width W1. The channel direction corresponds to the Y direction, which crosses the X direction (and the Z direction).

Figure 2:
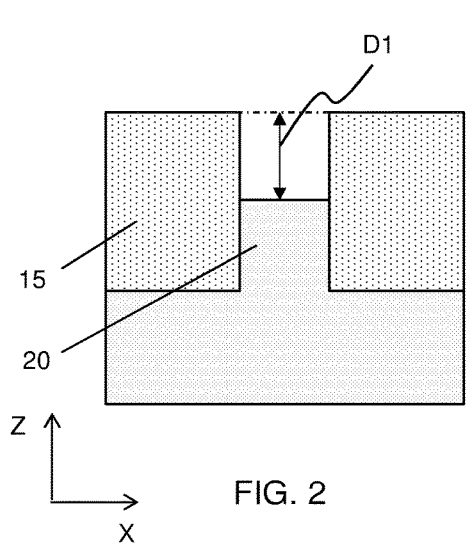
FIG. 2 shows an exemplary cross sectional view of one of the various stages for manufacturing a III-V semiconductor FET device according to one embodiment of the present disclosure.

After the STI 15 and the Si region 20 are formed, the Si region 20 is recessed (etched) down along the Z direction, as shown in FIG. 2. The Si region 20 can be selectively etched by using an HCl vapor, at a substrate temperature of about 700 to about 900° C. and at a reduced pressure of about 10 to about 100 Torr, in some embodiments. After the HCl etching, the bottom of the recessed Si region 20 has a substantially flat surface. The etched amount D1 is in a range from about 5 nm to about 20 nm in some embodiments.

Figure 3:
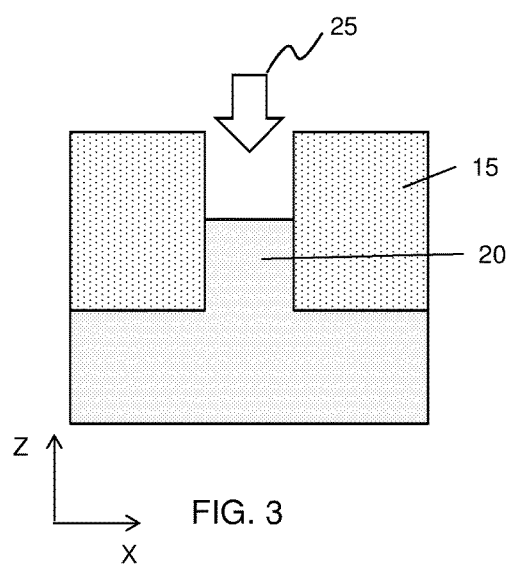
FIG. 3 shows an exemplary cross sectional view of one of the various stages for manufacturing a III-V semiconductor FET device according to one embodiment of the present disclosure.
Figure 4A:
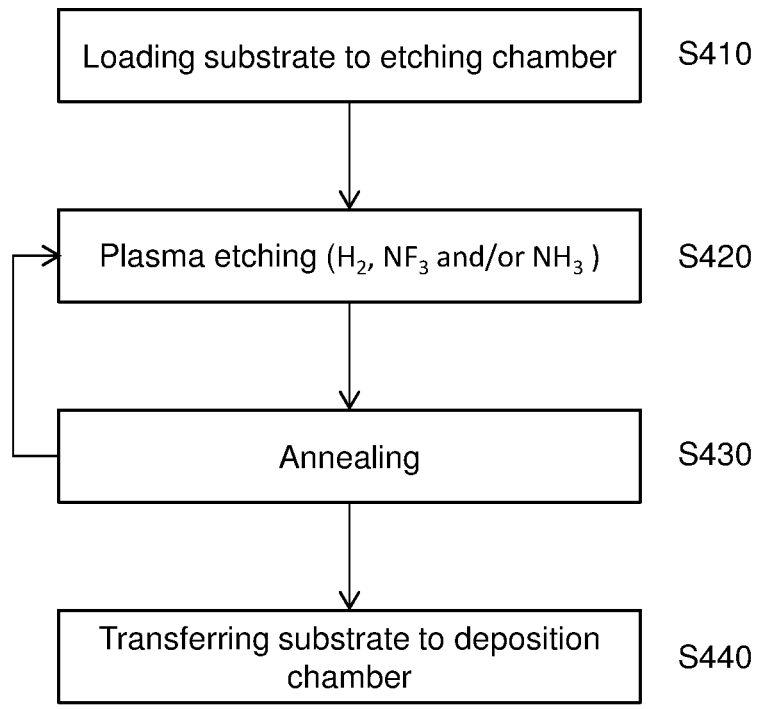
FIG. 4A shows a flow chart explaining a method of cleaning a surface of the substrate according to one embodiment of the present disclosure.
Figure 4B:
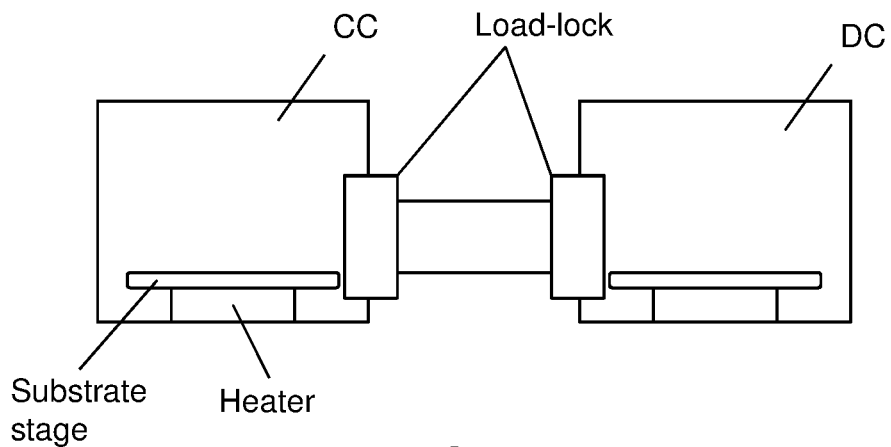
FIG. 4B shows an exemplary schematic view of cleaning and deposition chambers.

After the Si region 20 is recessed, a surface cleaning operation 25 is performed on the surface of the recessed Si region 20 as shown in FIG. 3. FIG. 4A shows a flow chart explaining a method of cleaning a surface of the substrate according to one embodiment of the present disclosure, and FIG. 4B shows an exemplary schematic view of cleaning and deposition chambers.

In this cleaning method, at S410, the substrate 10 with the recessed Si region and the STI 15 is loaded into a cleaning chamber CC.

At S420, the substrate (the surface of the recessed Si region) is exposed to plasma generated by using $NF_3$ and/or $NH_3$ gases with a dilute gas, such as $H_2$. The substrate is maintained at a temperature of about 25 to 100° C. during the plasma exposure in some embodiments. In some embodiments, the substrate is maintained at a temperature of about 40 to 60° C. The chamber CC is maintained at a pressure of about 0.1 to about 10 Torr during the plasma exposure in some embodiments.

The substrate 10 is exposed to the plasma for about 1 sec to about 10 sec in some embodiments. In other embodiments, the substrate 10 is exposed to the plasma for about 2 sec to about 5 sec.

Then after the plasma treatment, at S430, the substrate 10 is annealed at a temperature of 80-120° C. without the plasma exposure. The time duration of the annealing is in a range from about 30 sec to about 90 sec in some embodiments. In other embodiments, the time duration is in a range from about 50 sec to about 70 sec.

The operation S420 of exposing to plasma and the operation S430 of annealing are repeated for two to ten times, in some embodiments. In other embodiments, the operations S420 and S430 are repeated three to six times. The short repeated surface plasma treatments and annealing effectively prevent re-deposition of contamination from chamber walls.

By the foregoing cleaning operations, volatile components of the surface of the Si region can be removed. After the cleaning operation, at S440, the substrate is transferred to a deposition chamber DC under reduced-pressure without exposing the substrate to the atmosphere.

As shown in FIG. 5, in the deposition chamber DC, a first source gas 30 containing a Group V element is supplied to the surface of the Si region 20, while the substrate 10 is heated. In one embodiment, the Group V element is As, and the first source gas 30 is tertiary butyl arsine (TBA). The substrate 10 is heated at a temperature from about 480 to about 580° C. in some embodiments. In other embodiments, the substrate 10 is heated at a first temperature from about 510 to about 550° C., for example about 530° C. The flow rate of TBA is in a range from about 100 sccm to about 400 sccm in some embodiments. The TBA is supplied for a time duration of about 200 sec to 500 sec in some embodiments. In certain embodiments, the time duration is about 250 sec to about 350 sec, for example about 300 sec. By supplying a relatively high amount of TBA to the substrate, the surface of the Si region 20 is terminated with As atoms.

Figure 25A:
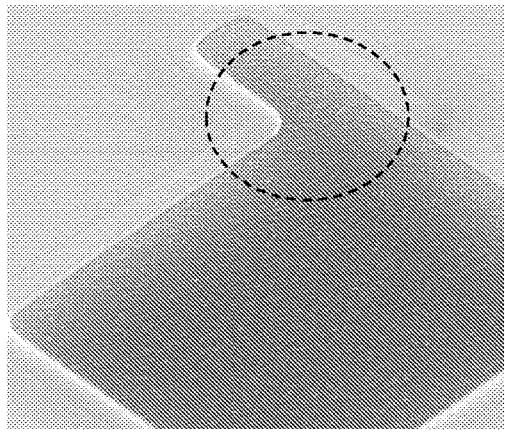
FIGS. 25A-25D show scanning electron microscope (SEM) images of nucleation layers and a seed layer.
Figure 25C:
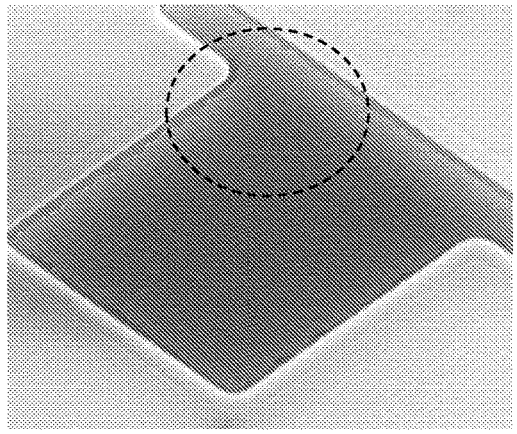
Figure 25B:
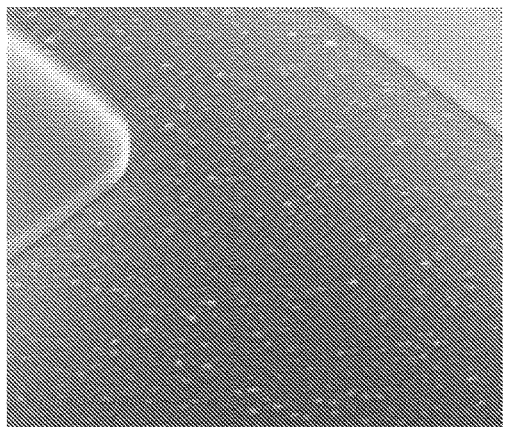

Then, as shown in FIG. 6, a second source gas 35 including a Group III element is supplied to the surface of the Si region 20, while the substrate 10 is heated at a second temperature. In one embodiment, the Group III element is In, and the second source gas 35 is tri-methyl indium (TMIn). The second temperature is lower than the first temperature, and is in a range from about 300 to about 400° C. in some embodiments. In certain embodiments, the second temperature is in a range from about 330 to about 370° C., for example about 350° C. The flow rate of TMIn is in a range from about 50 sccm to about 500 sccm in some embodiments, and is in a range from about 100 sccm to 300 sccm in other embodiments. By supplying the TMIn, InAs nucleation layers 40 having an island shape are formed on the surface of the Si region 20, as shown in FIG. 6. FIGS. 25A-25D show scanning electron microscope (SEM) images. FIG. 25A shows the InAs nucleation layers and FIG. 25B is an enlarged view of FIG. 25A. Each of the nucleation layers 40 is a monolayer of In and As. In some embodiments, the TMIn is supplied at the same time as the TBA is supplied. In such a case, the gas supply 35 includes both TMIn and TBA.

Figure 25D:

After the InAs nucleation layers 40 are formed, as shown in FIG. 7, the supply of TMIn is stopped, and the substrate is annealed at a third temperature higher than the second temperature, while supplying TBA 30. The flow rate of TBA is in a range from about 400 sccm to about 600 sccm in some embodiments. In some embodiments, the third temperature is in a range from about 460 to about 560° C. In certain embodiments, the third temperature is in a range from about 490 to about 530° C., for example about 510° C. The annealing at the third temperature is performed for about 200 sec to about 400 sec in some embodiments. In other embodiments, the annealing is performed for about 250 sec to about 350 sec, for example 300 sec. By this operation, the island shape InAs nucleation layers 40 become a seed layer 42, as shown in FIGS. 7 and 25C and 25D. FIG. 25C shows the seed layer 42 and FIG. 25D is an enlarged view of FIG. 25C. The thickness of the seed layer 42 is in a range from about 0.5 nm to about 5 nm in some embodiments, and in in a range from about 1 nm to about 3 nm in other embodiments.

Figure 26:
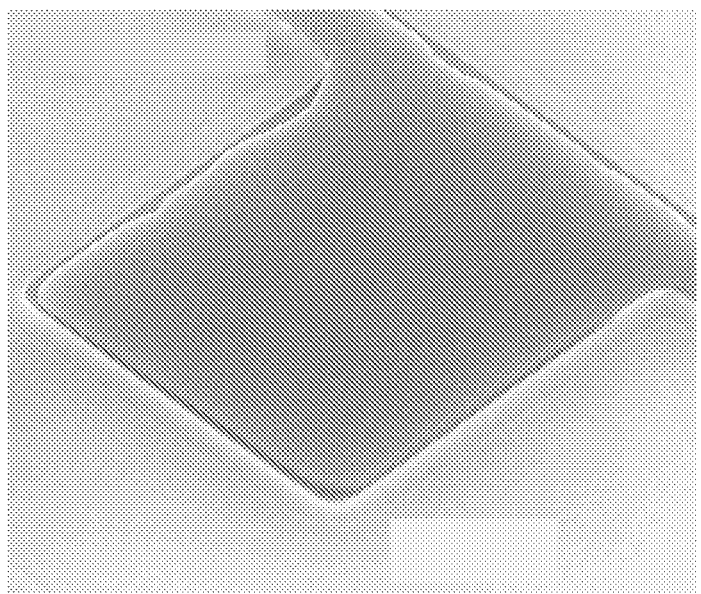
FIG. 26 shows an SEM image after a body InAs layer is formed.

After the annealing at the third temperature with TBA, supply of the second source gas TMIn is turned on, while heating the substrate at a fourth temperature. The flow rate of TMIn is in a range from about 50 sccm to about 500 sccm in some embodiments. The flow rate of TBA is in a range from about 400 sccm to about 600 sccm in some embodiments. In some embodiments, the fourth temperature is in a range from about 460 to about 560° C. In certain embodiments, the fourth temperature is in a range from about 490 to about 530° C., for example about 510° C. By this operation, a body InAs layer 45 is formed on the seed layer 42, as shown in FIG. 8. FIG. 26 shows an SEM image after the body InAs layer 45 is formed. The thickness of the body layer 45 is in a range from about 1 nm to about 40 nm in some embodiments, and is in a range from about 5 nm to about 30 nm in other embodiments. In some embodiments, the body layer 45 grows above the surface of the STI 15.

After the body layer 45 is formed, the thickness of the body layer 45 is reduced by a planarization operation, such as CMP, as shown in FIG. 9. The thickness of the body layer 45 after the thickness of the body layer 45 is reduced is in a range from about 2 to about 30 nm in some embodiments, and is in a range from about 1 nm to about 20 nm in other embodiments. A total thickness of the seed layer 42 and the body layer 45 after the thickness of the body layer 45 is reduced is in a range from about 3 to 40 nm in some embodiments, and is in a range from about 5 nm to about 30 nm in other embodiments.

Hereinafter, the combination of the seed layer 42 and the body layer 45 is referred to as III-V layer 50, as shown in FIG. 10. As set forth above, the thickness of the III-V layer 50 is in a range from about 3 to about 40 nm in some embodiments, and is in a range from about 5 nm to about 30 nm in other embodiments. The width of the III-V layer 50 is substantially equal to W1 (see, FIG. 1B) and is in a range from about 5 nm to about 50 nm in some embodiments, and is in a range from about 10 nm to about 20 nm in other embodiments.

Figures 11A, 11B:
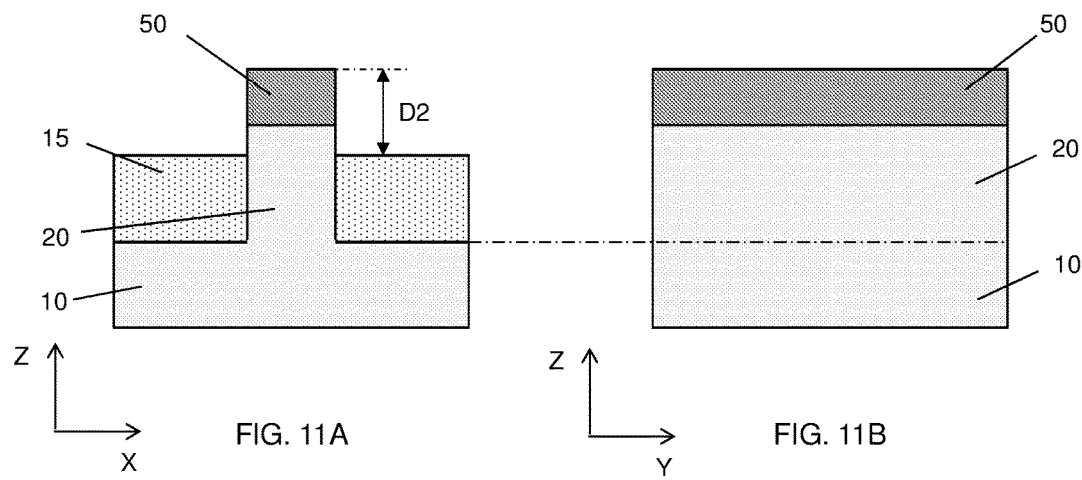
FIGS. 11A and 11B show exemplary cross sectional views of one of the various stages for manufacturing a III-V semiconductor FET device according to one embodiment of the present disclosure.

FIGS. 11A and 11B show exemplary cross sectional views of one of the various stages for manufacturing a III-V semiconductor FET device according to one embodiment of the present disclosure. FIG. 11A corresponds to the cross sectional view along X-X of FIG. 1B, and FIG. 11B corresponds to the cross sectional view along Y-Y of FIG. 1B.

Subsequent to the operations of FIG. 10, the height of the STI 15 is reduced (recessed) so as to expose a part of the Si region 20 under the III-V layer 50, as shown in FIG. 11A. The STI 15 can be partially removed by dry and/or wet etching. After the height of the STI 15 is reduced, the height D2 of the upper surface of the III-V layer 50 from the surface of the STI 15 is in a range from about 5 nm to about 30 nm in some embodiments, and is in a range from about 10 nm to about 20 nm in other embodiments.

Figures 12A, 12B:
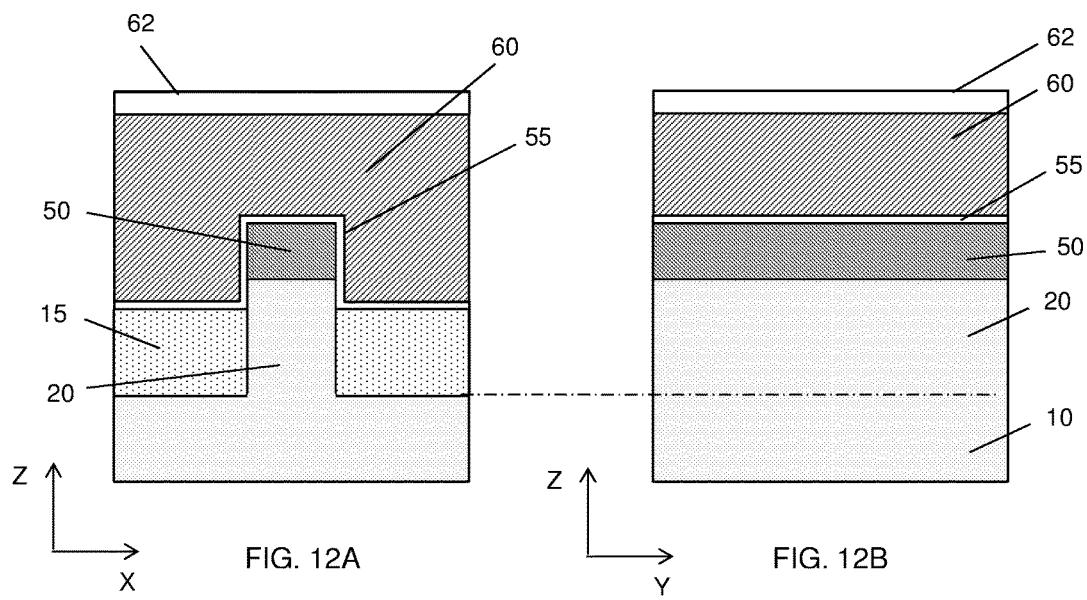
FIGS. 12A and 12B show exemplary cross sectional views of one of the various stages for manufacturing a III-V semiconductor FET device according to one embodiment of the present disclosure.

After the STI 15 is recessed, a dummy gate dielectric layer 55 and a dummy gate electrode layer 60 are formed, as shown in FIGS. 12A and 12B. Further, a hard mask layer 62, made of, for example, silicon oxide, silicon nitride or silicon oxynitride, is formed on the dummy gate electrode layer 60. The dummy gate dielectric layer 55 is made of, for example, silicon oxide, and the dummy gate electrode layer 60 is made of, for example, polysilicon. The dummy gate dielectric layer 55, the dummy gate electrode 60 and the hard mask layer 62 can be formed by a suitable film forming method, such as CVD. The thickness of the dummy gate dielectric layer 55 is in a range from about 2 nm to about 20 nm and the thickness of the dummy gate electrode layer 60 as deposited is in a range from about 150 nm to about 500 nm, in some embodiments. The thickness of the hard mask layer 62 as deposited is in a range from about 50 nm to about 200 nm in some embodiments. In some embodiments, after the polysilicon layer 60 is deposited, a planarization operation, such as CMP and an etch-back operation, is performed. After the planarization operation, the thickness of the polysilicon layer 60 is in a range from about 80 nm to about 120 nm in some embodiments.

After the dummy gate dielectric layer and the dummy gate electrode layer are formed, these dummy layers are patterned to form a dummy gate structure, as shown in FIGS. 13A and 13B. The width W2 of the dummy gate electrode 60 is in a range from about 10 nm to about 200 nm in some embodiments, and is in a range from about 20 nm to about 100 nm in other embodiments. The dummy gate electrode layer made of polysilicon can be patterned by using a patterned hard mask layer as an etching mask.

After the dummy gate structure is formed, sidewall spaces 65 are formed on both side faces of the dummy gate structure along the X direction as shown in FIGS. 14A and 14B. The sidewall spacers 65 are made of silicon oxide and/or silicon nitride, which can be made by CVD or ALD (atomic layer deposition).

After the sidewall spacers are formed, an in-situ doped epitaxial layer 70, for example, a Si-doped InAs layer, is formed on the source/drain region of the III-V layer 50, as shown in FIGS. 15A and 15B. The epitaxial layer 70 is selectively formed only on the source/drain region of the III-V layer 50. In some embodiments, the surface of the source/drain region of the III-V layer 50 is treated with HF to remove oxide. An initial epitaxial growth for nucleation is performed by using TMIn and TBA with $SiH_4$ at a substrate temperature of about 325-375° C. in some embodiments. The thickness of the nucleation layer is in a range from about 1 nm to about 5 nm in some embodiments. Then, a main epitaxial growth is performed using TMIn and TBA with $SiH_4$ at a substrate temperature of about 400-450° C. in some embodiments. The thickness of the main epitaxial layer is in a range from about 5 nm to about 10 nm in some embodiments.

Then, as shown in FIGS. 16A and 16B, a first interlayer dielectric layer (ILD) 75 is formed. The first ILD layer 75 includes one or more layers of silicon oxide, SiOC, SiOCN or SiCN or other low-k materials, or porous materials. After a planarization operation, the dummy gate electrode 60 is removed as shown in FIGS. 17A and 17B, and further the dummy gate dielectric layer 55 is removed as shown in FIGS. 18A and 18B, so as to make a gate space 80.

Figure 19A:
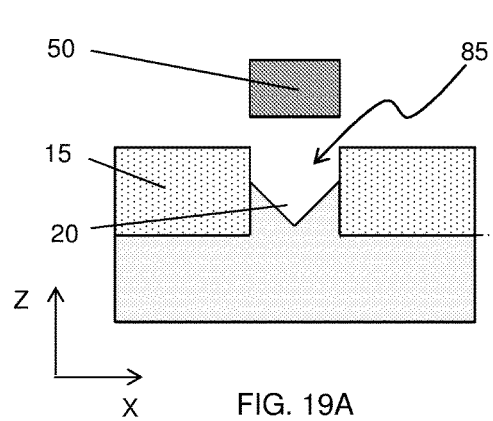
FIGS. 19A and 19B show exemplary cross sectional views of one of the various stages for manufacturing a III-V semiconductor FET device according to one embodiment of the present disclosure.
Figure 19B:
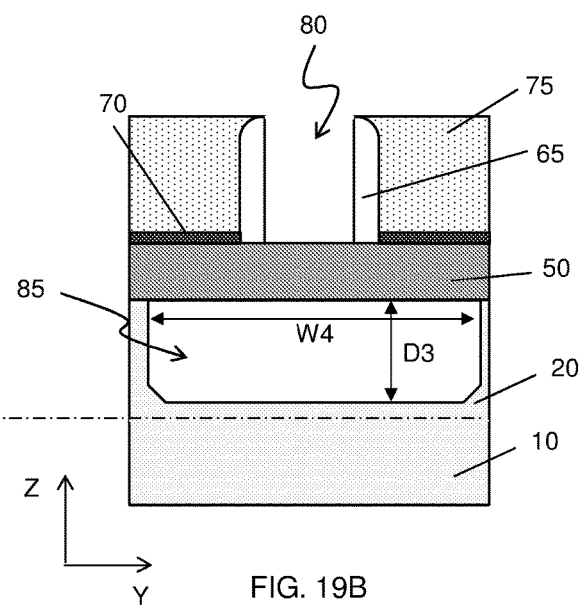

Then, through the gate space 80, the Si region 20 under the III-V layer 50 is recessed, thereby forming a space 85, as shown in FIGS. 19A and 19B. The Si region 20 can be etched by wet etching using tetra methyl ammonium hydroxide (TMAH) or HCl. In one embodiment, TMAH is used. Due to the anisotropic nature of TMAH etching characteristics of Si crystals, a V-shaped Si surface is formed at the bottom of the recessed Si region 20 when a (001) Si substrate is used, as shown in FIG. 19A. When a (111) Si substrate is used, a flat bottom Si surface is obtained.

The depth D3 of the space 85 is in a range from about 50 nm to about 500 nm in some embodiments. The width W4 of the space 85 along the channel direction is greater than the width of the gate space 80, which is substantially equal to the width W2 of the dummy gate electrode, and is in a range from about 100 nm to about 2000 nm in some embodiments.

Figure 20A:
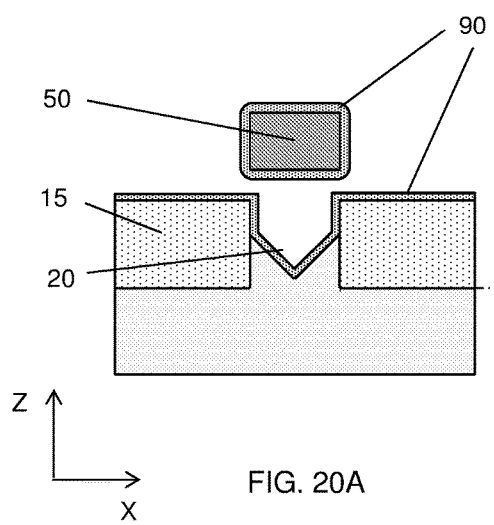
FIGS. 20A and 20B show exemplary cross sectional views of one of the various stages for manufacturing a III-V semiconductor FET device according to one embodiment of the present disclosure.
Figure 20B:
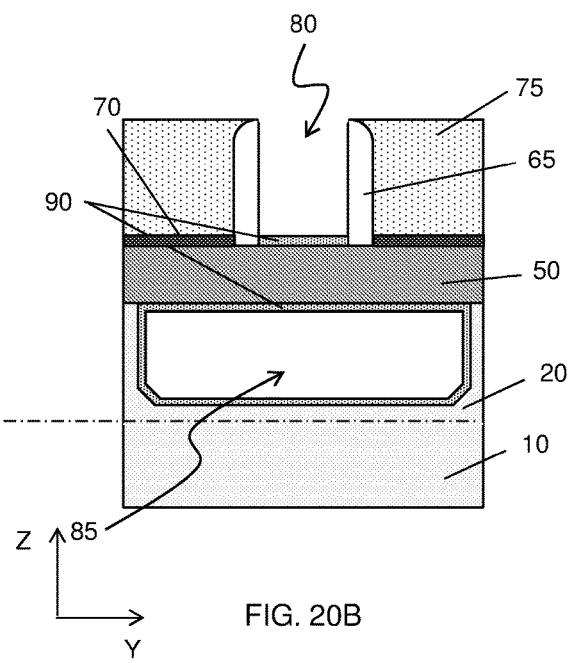

After the space 85 is formed, a gate dielectric layer 90 is formed around the III-V layer 50, as shown in FIGS. 20A and 20B. The gate dielectric layer 90 can be formed by CVD or ALD, and is also formed on the surfaces of the STI 15 and the recessed Si region 20. The gate dielectric layer 90 includes a high-k dielectric material having a dielectric constant higher than 10, such as, one or more oxides of Hf, Y, Ta, Ti, Al and Zr. In certain embodiments, $HfO_2$ is used.

Figure 21A:
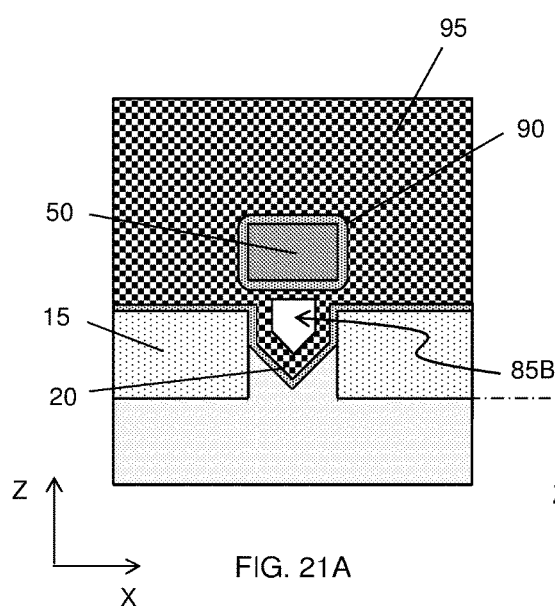
FIGS. 21A and 21B show exemplary cross sectional views of one of the various stages for manufacturing a III-V semiconductor FET device according to one embodiment of the present disclosure.
Figure 21B:
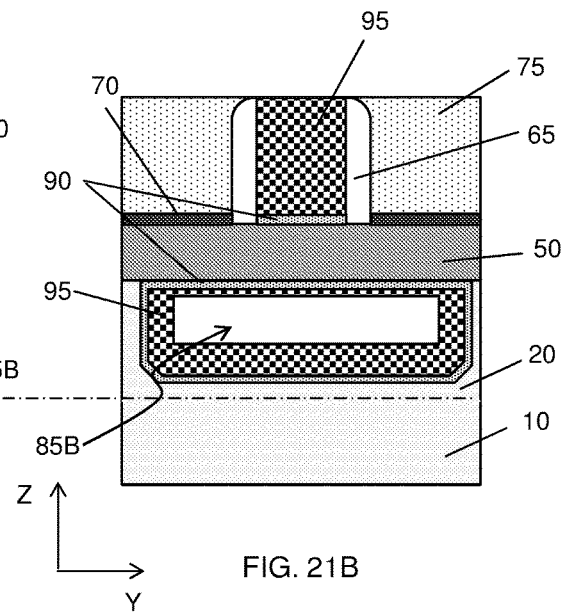

After the gate dielectric layer 90 is formed, a gate electrode 95 is formed, as shown in FIGS. 21A and 21B. The openings 80 and 85 are filled with one or more layers of conductive material, so as to form the gate electrode 95. The conductive material includes one or more of Al, Cu, W, Co, Ti, Ta, TiN, TiAl, TiAlC, TiAlN, TaN, NiSi, CoSi, and other conductive materials. The conductive material is first deposited by CVD, ALD or physical vapor deposition (PVD) including sputtering. After the deposition, a planarization operation, such as CMP, is performed to remove the upper portion of the deposited conductive material. In some embodiments, as shown in FIGS. 21A and 21B, a void 85B is formed in the space 85.

Figure 22A:
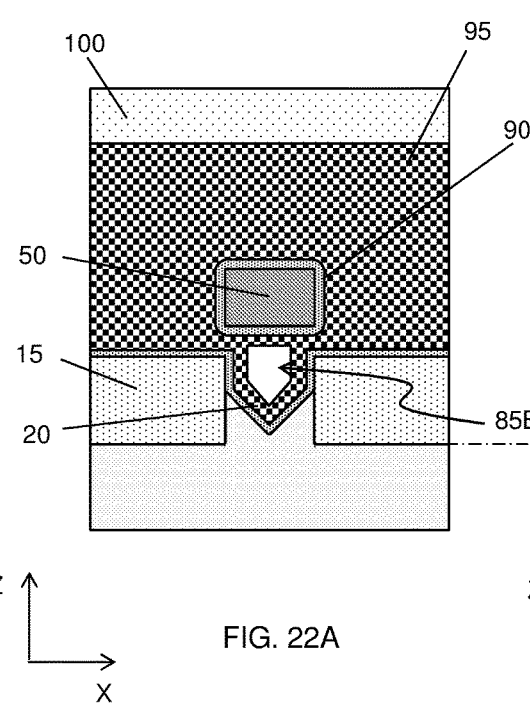
FIGS. 22A and 22B show exemplary cross sectional views of one of the various stages for manufacturing a III-V semiconductor FET device according to one embodiment of the present disclosure.
Figure 22B:
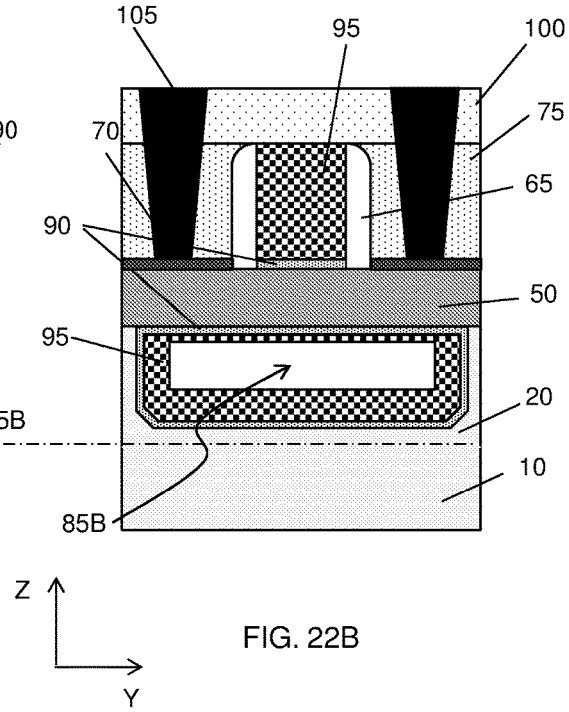

Further, a second ILD layer 100 is formed, contact holes are formed and the contact holes are filled with a conductive material, thereby forming source/drain contacts 105. Accordingly a GAA FET using a III-V layer is obtained, as shown in FIGS. 22A and 22B. The second ILD layer 100 includes one or more layers of silicon oxide, SiOC, SiOCN or SiCN or other low-k materials, or porous materials. The conductive material for the source/drain contacts includes one or more of Al, Cu, W, Co, Ti, Ta, TiN, TiAl, TiAlC, TiAlN, TaN, NiSi, CoSi, and other conductive materials.

Figure 23:
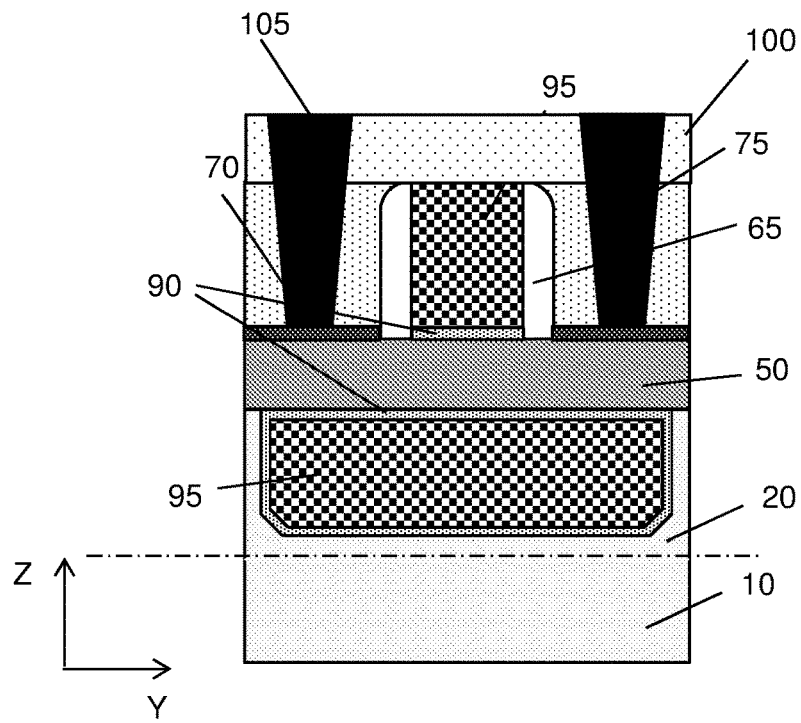
FIG. 23 shows an exemplary cross sectional view of a III-V semiconductor FET device according to another embodiment of the present disclosure.
Figure 24:
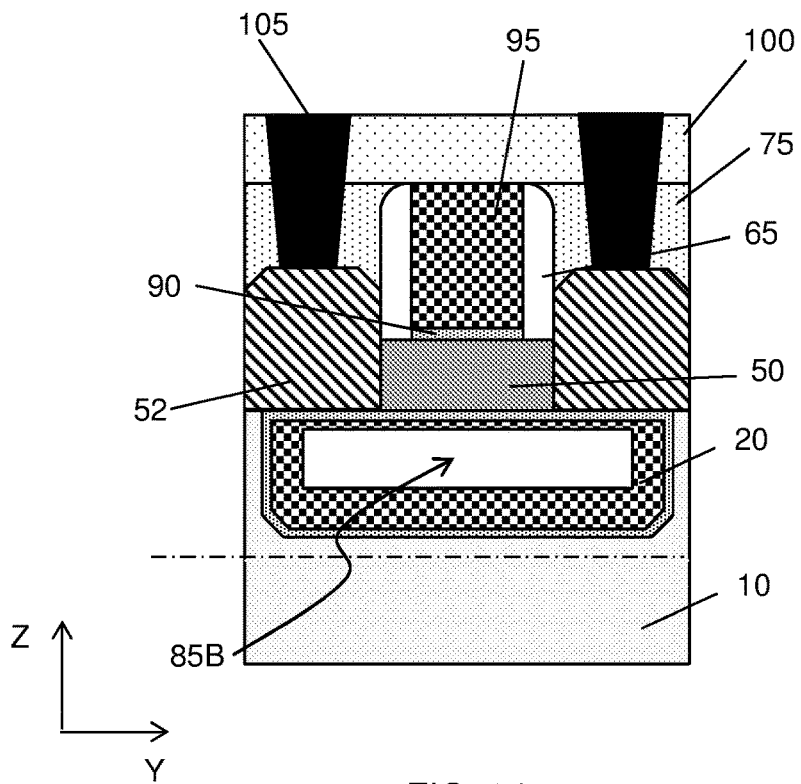
FIG. 24 shows an exemplary cross sectional view of a III-V semiconductor FET device according to another embodiment of the present disclosure.

In certain embodiments, the space 85 is fully filled by the conductive material 95 and no void is formed, as shown in FIG. 23. In certain embodiments, the source/drain region of the III-V layer 50 is removed and raised source/drain structures 52 are formed, as shown in FIG. 24. The raised source/drain structures 52 include semiconductor crystal material and provide appropriate stress to the channel. In some embodiments, the raised source/drain structures 52 are formed without removing the source/drain region of the III-V layer 50, thereby forming multi-layer source/drain structure.

In one embodiment, the III-V (InAs) layer 50 is a nanowire (NW) structure having a thickness of about 4-5 nm and a width of about 40-50 nm. InAs NW GAA FETs according to one embodiment of the present disclosure exhibit a peak transconductance of 1700 µS/µm when the gate length $L_g$=70 nm, a subthreshold swing SS=95 mV/dec and an on/off current ratio $I_{on}/I_{off}$>$10^6$ when $L_g$=500 nm at a source-drain voltage $V_{ds}$=0.5 V.

In FIGS. 22A-24, one InAs nano-wire is used as a channel of a GAA FTE. In other embodiments, two or more InAs nano-wires are used as multi-channel structure to obtain a desired current value.

Figure 27C:
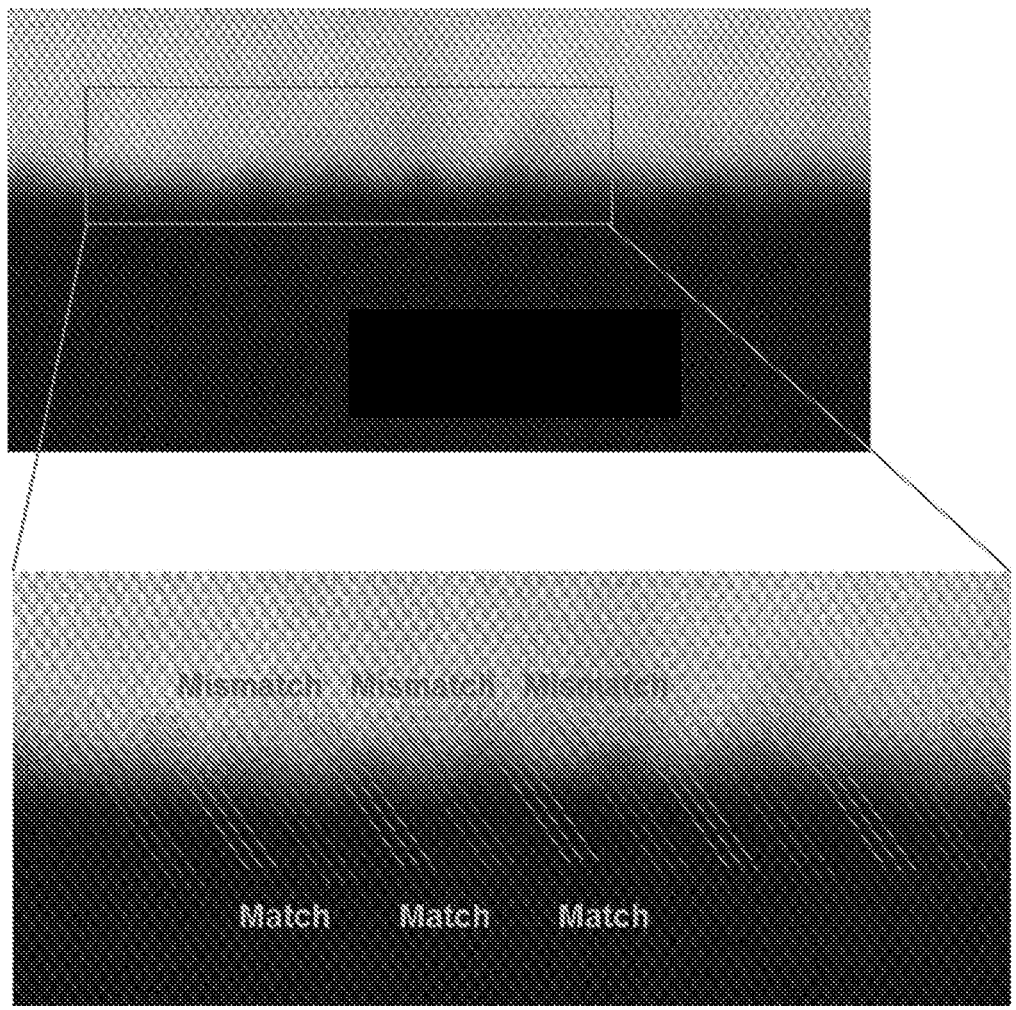

FIGS. 27A and 27C show images of the InAs layers directly grown on the Si substrate observed by high-resolution cross-sectional transmission electron microscopy (HRTEM) and FIG. 27B shows an image of the InAs layers directly grown on the Si substrate observed by atomic force microscopy (AFM). In FIGS. 27A and 27B, a 7 nm InAs layer is directly epitaxially-grown on a (111) Si substrate, and in FIG. 27C, a 60 nm InAs layer is directly epitaxially-grown on a (100) Si substrate.

As shown in FIGS. 27A and 27C, the HRTEM images show the single-crystal, defect free structures of the InAs layer formed by the operations according to the present disclosure. As shown in FIG. 27B, the AFM surface scan image shows the smooth surface morphology (surface roughness RMS=0.13 nm). As shown in FIGS. 27A-27C, a semiconductor layer structure includes a single crystal silicon substrate with a first relaxed lattice parameter, a single-crystal III-V compound semiconductor layer (e.g., InAs) with a second relaxed lattice parameter. The silicon/III-V semiconductor interface has a periodic array of defects spatially confined to the interface.

For the Si—InAs (111) interface as shown in FIG. 27A, plastic relaxation of InAs on top of Si forms misfit dislocations. These dislocations are caused by slip of (111) planes in the diamond lattice structure, which have a screw component that threads parallel to the Si—InAs (111) interface, so there are no defects in the grown InAs threading perpendicular to the interface. For the Si—InAs (001) interface as shown in FIG. 27C, the defects in the TEM image are Lomer misfit dislocations. The Burgers vector in Lomer misfit dislocation is parallel to the (001) interface. Therefore, the substrate and film lattices can match while no perpendicular component exists. The InAs is grown relaxed without introducing threading dislocations, which could degrade the material quality. Lomer dislocations can combine two lattices through symmetric and asymmetric loops. FIGS. 27A and 27C show characteristic of these symmetric and asymmetric loops at Si/InAs interface.

Figure 28B:
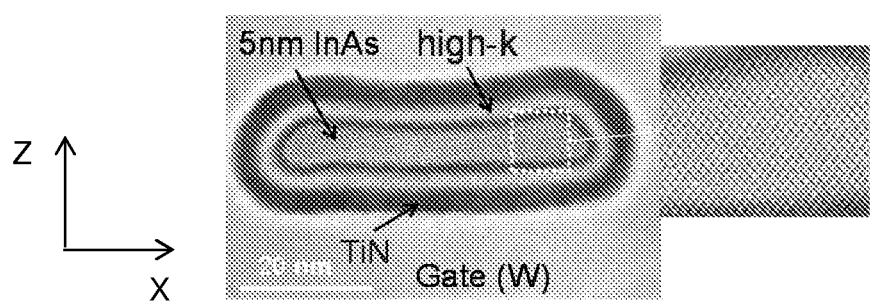
FIG. 28B shows a cross sectional view of the InAs NW perpendicular to the channel direction.
Figure 28A:
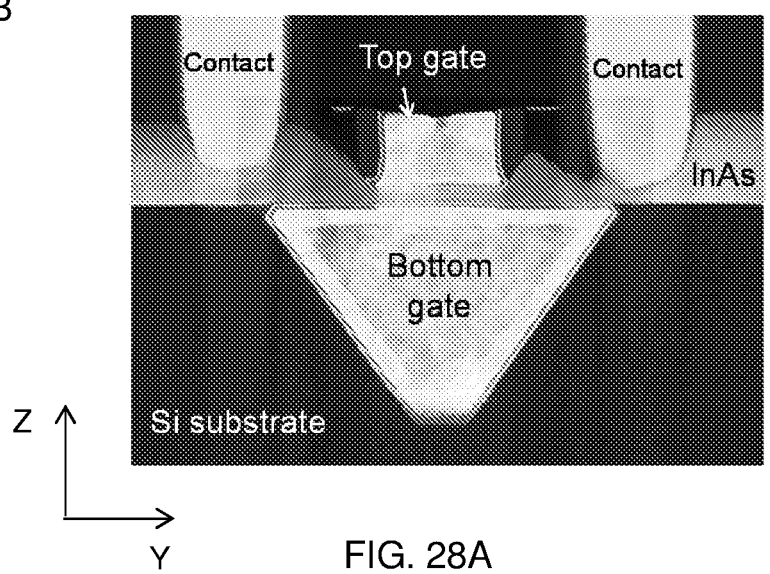
FIG. 28A shows a TEM cross sectional image of a nano-wire (NW) gate-all-around (GAA) FET with InAs channel directly grown on Si(100), fabricated by a method according to the present disclosure.

FIG. 28A shows a TEM cross sectional image of a NW GAA FET with an InAs channel directly grown on Si(100) surface, fabricated by a method according to the present disclosure. FIG. 28B shows a cross sectional view of the InAs NW perpendicular to the channel direction. For this device, the NW thickness is 5 nm and the NW width is 40 nm resulting, in a total gate periphery of 90 nm.

Figure 29A:
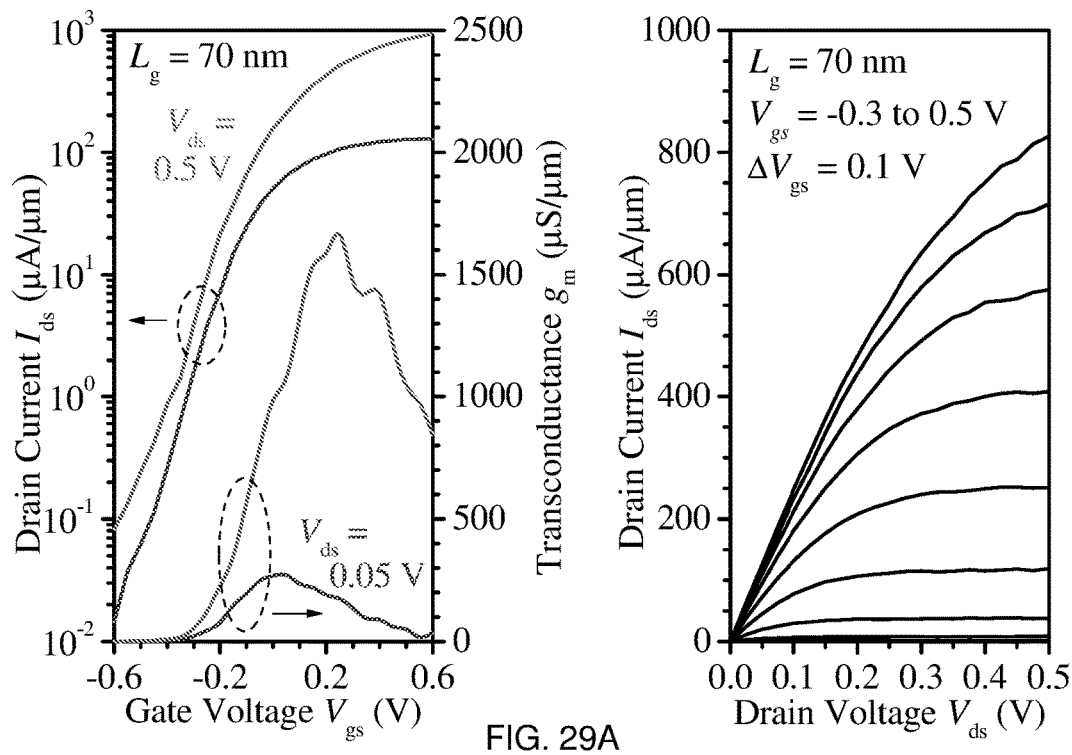
FIGS. 29A-29C show transfer ($I_{ds}$-$V_{gs}$) and output characteristics ($I_{ds}$-$V_{ds}$) of the NW GAA FET.
Figure 29B:
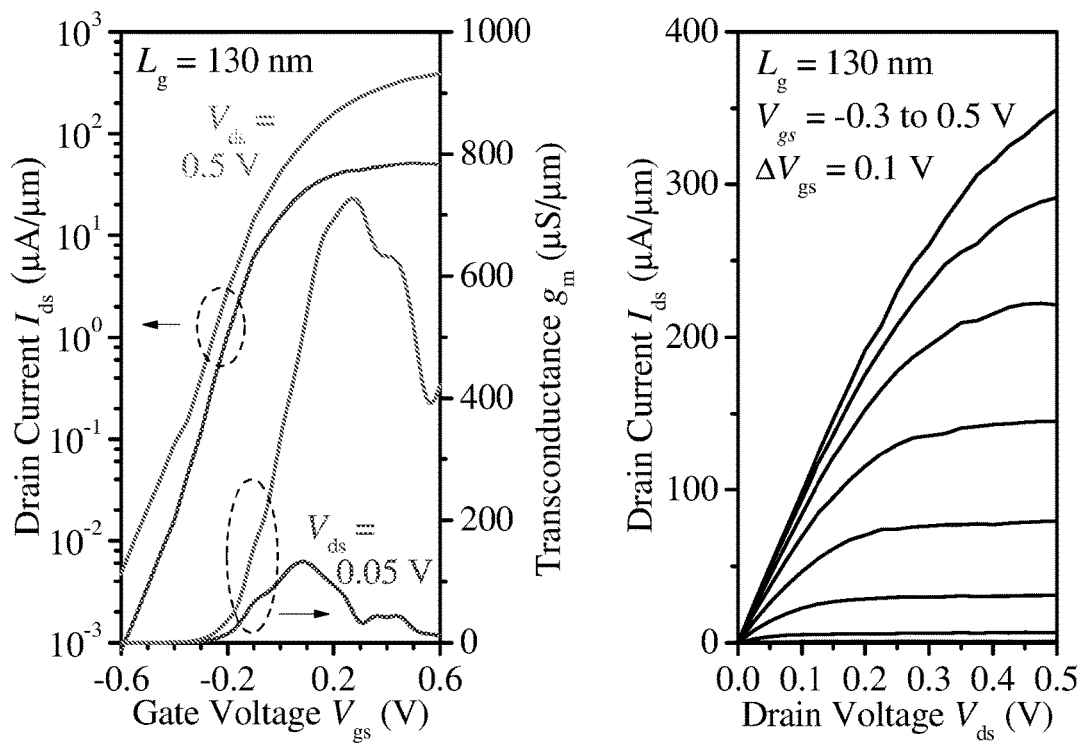
Figure 29C:
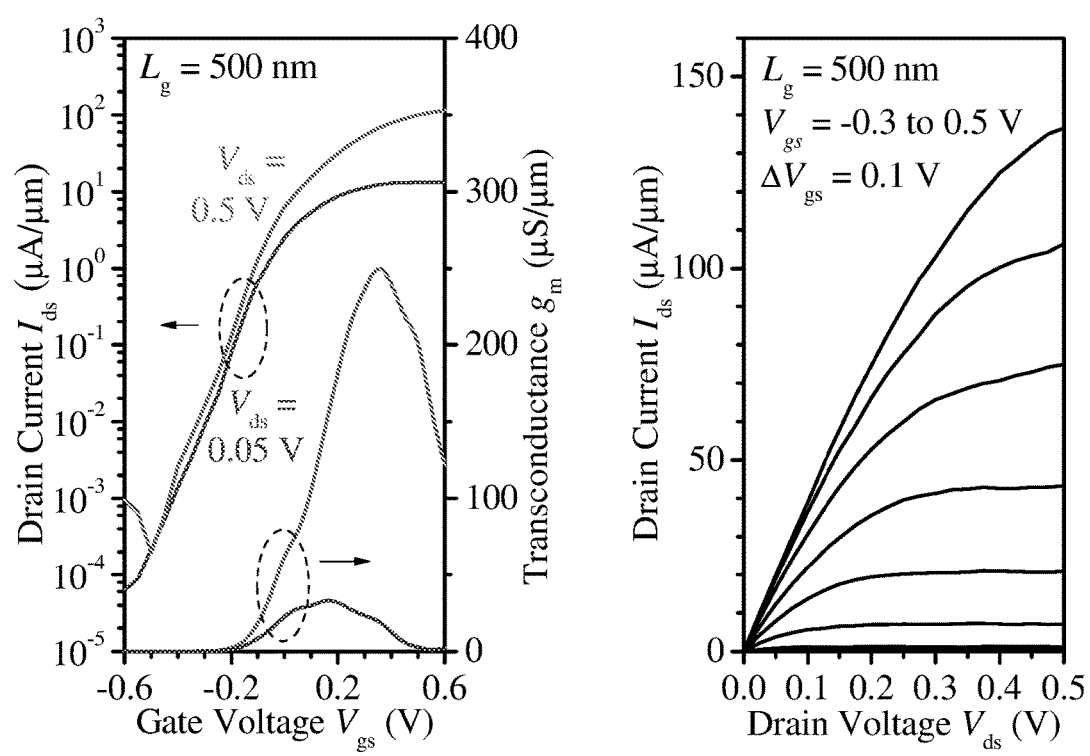

FIGS. 29A-29C show transfer ($I_{ds}$-$V_{gs}$) and output characteristics ($I_{ds}$-$V_{ds}$) of the NW GAA FET with an InAs channel directly grown on a Si(100) surface, with different gate lengths $L_g$, fabricated by a method according to the present disclosure. FIG. 29A is the case for a gate lengths $L_g$ of 70 nm, FIG. 29B is the case for $L_g$ equal to 130 nm, and FIG. 29C is the case for $L_g$ equal to 500 nm. The InAs NW channel has a height of 4-5 nm and the current is normalized to the total gate periphery between 105 and 120 nm. The measured peak transconductance $g_m$ of 1700 µS/µm, subthreshold swing SS of 114 mV/dec and Q=$g_m$/SS of 15.4 are obtained for Lg=70 nm at $V_{ds}$=0.5 V. For $L_g$=130 nm, $g_m$=731 µS/µm and SS=115 mV/dec are obtained at $V_{ds}$=0.5 V. For $L_g$=500 nm, $g_m$=255 µS/µm, SS=95 mV/dec, and $I_{on}/I_{off}$>$10^6$ are observed at $V_{ds}$=0.5 V.

It will be understood that not all advantages have been necessarily discussed herein, no particular advantage is required for all embodiments or examples, and other embodiments or examples may offer different advantages.

According to some embodiments of the present disclosure, since the Group III-V (e.g., InAs) compound semiconductor layer can be directly formed on the Si substrate, without forming a buffer layer, it is possible to simplify the fabrication process and to reduce manufacturing cost.

In accordance with one aspect of the present disclosure, in a method of forming a Group III-V semiconductor layer on a Si substrate, a first source gas containing a Group V element is supplied to a surface of the Si substrate while heating the substrate at a first temperature, thereby terminating the Si surface with the Group V element. Then, a second source gas containing a Group III element is supplied to the surface while heating the substrate at a second temperature, thereby forming a nucleation layer directly on the surface of the Si substrate. After the nucleation layer is formed, the supply of the second source gas is stopped, and the substrate is annealed at a third temperature while the first source gas being supplied, thereby forming a seed layer. After the annealing, the second source gas is supplied, while heating the substrate at a fourth temperature, thereby forming a body III-V semiconductor layer on the seed layer.

In accordance with another aspect of the present disclosure, in a method of forming a gate-all-around field effect transistor (GAA FET), a shallow-trench-isolation (STI) is formed in a silicon (Si) substrate, where the STI surrounds a Si region of the silicon substrate. The Si region is recessed. After the Si region is recessed, a Group III-V semiconductor layer is formed directly on a surface of the recessed Si region. After the Group III-V semiconductor layer is formed, the STI is recessed so as to expose a part of the Si substrate under the Group III-V semiconductor layer. A dummy dielectric layer is formed on the Group III-V semiconductor layer. A dummy polysilicon layer is formed on the dummy dielectric layer. The dummy polysilicon layer is patterned, thereby forming a dummy gate. Sidewall spacers are formed on opposing side faces of the dummy gate. After the sidewall spacers are formed, a first interlayer dielectric (ILD) layer is fowled. The dummy gate is removed, thereby forming an opening. After the opening is formed, the Si substrate under the Group III-V semiconductor layer is recessed. A gate dielectric layer and a conductive gate layer are formed around the Group III-V semiconductor layer.

In accordance with another aspect of the present disclosure, a gate-all-around field effect transistor (GAA FET) includes an InAs nano-wire as a channel layer, a gate dielectric layer wrapping around the InAs nano-wire, and a gate electrode metal layer formed on the gate dielectric layer. A thickness of the InAs nano-wire is 3 to 10 nm. The GAA FET is formed over a Si substrate. The gate dielectric layer includes a high-k dielectric material having a dielectric constant higher than 10. The InAs nano-wire includes no defect observable by a transmission electron microscope.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gate-all-around field effect transistor (GAA FET), comprising:
    an InAs nano-wire including a channel layer;
    a gate dielectric layer wrapping around the InAs nano-wire; and
    a gate electrode metal layer formed on the gate dielectric layer, wherein:
        the GAA FET is formed over a Si substrate, and
        a void is disposed between the InAs nano-wire and the Si substrate.

2. The GAA FET of claim 1, wherein a width of the InAs nano-wire is in a range from 5 nm to 50 nm, and wherein a thickness of the InAs nano-wire is in a range from 3 nm to 10 nm.

3. The GAA FET of claim 1, wherein the gate dielectric layer includes oxide of one or more selected from the group consisting of Hf, Y, Ta, Ti, Al and Zr.

4. The GAA FET of claim 1, wherein the gate dielectric layer includes $HfO_2$.

5. The GAA FET of claim 1, wherein the InAs nano-wire includes no defect observable by transmission electron microscope.

6. The GAA FET of claim 1, wherein the InAs nano-wire is partially in contact with the Si substrate.

7. The GAA FET of claim 1, wherein a width of the void in a source-drain direction is greater than a width of the gate electrode metal layer in the source-drain direction.

8. The GAA FET of claim 1, wherein the void is enclosed by the gate electrode metal layer.

9. The GAA FET of claim 1, wherein the Si substrate below the InAs nano-wire has a V-shape groove.

10. The GAA FET of claim 9, wherein the gate dielectric layer is disposed on a surface of the V-shape groove.

11. The GAA FET of claim 9, wherein a void is disposed between the InAs nano-wire and the V-shape groove.

12. The GAA FET of claim 11, wherein a width of the void in a source-drain direction is greater than a width of the gate electrode metal layer in the source-drain direction.

13. The GAA FET of claim 11, wherein the void is enclosed by the gate electrode metal layer.

14. The GAA FET of claim 1, further comprising at least one of a source or a drain epitaxial layer formed on the InAs nano-wire.

15. The GAA FET of claim 14, wherein the at least one of the source or the drain epitaxial layer is a Si-doped InAs layer.

16. The GAA FET of claim 1, wherein the InAs nano-wire is not in contact with the Si substrate.

17. A gate-all-around field effect transistor (GAA FET), comprising:
    an InAs nano-wire as a channel layer;
    a source and a drain disposed on end face of the InAS nano-wire, respectively;
    a gate dielectric layer wrapping around the InAs nano-wire; and
    a gate electrode metal layer formed on the gate dielectric layer, wherein:
        the GAA FET is formed over a Si substrate, and
        a void is disposed between the InAs nano-wire and the Si substrate.

18. The GAA FET of claim 17, wherein bottoms of the source and the drain are in contact with the gate dielectric layer laterally extending from a gate.

19. The GAA FET of claim 17, wherein the InAs nano-wire is partially in contact with the Si substrate.

20. A gate-all-around field effect transistor (GAA FET), comprising:
    an InAs nano-wire including a channel layer;
    a gate dielectric layer wrapping around the InAs nano-wire; and
    a gate electrode metal layer formed on the gate dielectric layer, wherein:
    the GAA FET is formed over a Si substrate,
    the InAs nano-wire is located above a protruding portion of the Si substrate surrounded by an isolation insulating layer, and
    a void is disposed between the InAs nano-wire and the Si substrate.

* * * * *